United States Patent
Goverde et al.

(10) Patent No.: US 10,192,009 B2
(45) Date of Patent: Jan. 29, 2019

(54) SIMULATION OF PHOTOVOLTAIC MODULES

(71) Applicants: IMEC VZW, Leuven (BE); Katholieke Universiteit Leuven, KU LEUVEN R&D, Leuven (BE)

(72) Inventors: Hans Goverde, Eindhoven (NL); Francky Catthoor, Temse (BE); Vikas Dubey, Leuven (BE); Jef Poortmans, Kessel-Lo (BE); Christiaan Baert, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 422 days.

(21) Appl. No.: 14/856,100

(22) Filed: Sep. 16, 2015

(65) Prior Publication Data
US 2016/0078159 A1    Mar. 17, 2016

(30) Foreign Application Priority Data

Sep. 16, 2014    (EP) .................................... 14184926

(51) Int. Cl.
*G06F 17/50*    (2006.01)
*H02S 50/10*    (2014.01)
(Continued)

(52) U.S. Cl.
CPC .......... *G06F 17/5009* (2013.01); *G06F 17/10* (2013.01); *H02S 50/00* (2013.01); *H02S 50/10* (2014.12)

(58) Field of Classification Search
USPC .................................... 703/2, 6, 18; 136/253
See application file for complete search history.

(56) References Cited

U.S. PATENT DOCUMENTS

| | | | | |
|---|---|---|---|---|
| 5,338,369 A | * | 8/1994 | Rawlings | ................. F24J 2/045 136/246 |
| 2012/0152317 A1 | * | 6/2012 | Celaya Prieto | ....... H01L 31/048 136/246 |

(Continued)

OTHER PUBLICATIONS

Goverde, H. et al., "4AV.5.34 Optical-Thermal-Electrical Model for a Single Cell PV Module in Non-Steady-State and Non-Uniform Conditions Build in Spice", 28th European Photovoltaic Solar Energy Conference and Exhibition, 2013, pp. 3291-3295.

(Continued)

*Primary Examiner* — Thai Q Phan
(74) *Attorney, Agent, or Firm* — McDonnell Boehnen Hulbert & Berghoff LLP (57) ABSTRACT

A method is provided for calculating a performance of a photovoltaic module comprising at least a first photovoltaic cell and a second photovoltaic cell. The method comprises calculating a heat flow between the first photovoltaic cell and the second photovoltaic cell using a first thermal equivalent circuit of the first photovoltaic cell and a second thermal equivalent circuit of the second photovoltaic cell, wherein at least one node of the first thermal equivalent circuit is connected to a corresponding node of the second thermal equivalent circuit by a thermal coupling resistance. The method may be used for calculating the influence of spatial and temporal variations in the operation conditions on the performance, such as the energy yield, of a photovoltaic module or a photovoltaic system.

14 Claims, 6 Drawing Sheets

(51) Int. Cl.
  *G06F 17/10* (2006.01)
  *H02S 50/00* (2014.01)

(56) References Cited

U.S. PATENT DOCUMENTS

2016/0162616 A1* 6/2016 Hasan ................. G06F 17/5018
  703/2
2016/0164451 A1* 6/2016 Lenert .................... H02S 10/30
  136/253

OTHER PUBLICATIONS

"Double Diode Model"; PV Education; retrieved copy from web.archive.org; archived from URL https://www. pveducation.org/pvcdrom/characterisation/double-diode-model on Sep. 5, 2014.

"Analysis and Investigation of a Two-Diode Solar Cell Using MATLAB/Simulink"; Tarek Selmi, et al.; International Journal of Renewable Energy Research; vol. 4, No. 1, Feb. 9, 2014.

"A Review of Diode and Solar Cell Equivalent Circuit Model Lumped Parameter Extraction Procedures"; Adelmo Ortiz-Conde, et al.; Facta Universitatis, Electronics and Energetics, vol. 27, No. 1, Mar. 2014.

\* cited by examiner

SIMULATION OF PHOTOVOLTAIC MODULES

CROSS-REFERENCE TO RELATED APPLICATIONS

The present application is a non-provisional patent application claiming priority to European Patent Application No. 14184926.5 filed Sep. 16, 2104, the contents of which are hereby incorporated by reference.

FIELD OF THE DISCLOSURE

The disclosure relates to the field of photovoltaic modules. More specifically it relates to a method for modeling and simulation of photovoltaic modules, e.g. a multi-physics simulation of optical, thermal and electrical properties under non-steady-state and non-uniform operating conditions

BACKGROUND OF THE DISCLOSURE

The performance of a photovoltaic module is significantly affected by the ambient conditions it is subjected to. For example, the electrical performance and the energy conversion efficiency of a module are directly affected by the module temperature. The temperature of a photovoltaic module changes with changing ambient conditions such as ambient temperature, irradiance, wind speed and wind direction, and the module temperature also depends on the thermal history of the module. Furthermore, non-uniform conditions, such as non-uniform illumination of a photovoltaic module, e.g. due to shadowing effects, strongly affect the electrical performance of a photovoltaic module.

In order to simulate and/or predict the energy production, e.g. the energy yield, of a photovoltaic module or system, a need exists for suitable simulation models that allow the calculation of energy losses within a module while taking optical, thermal and electrical aspects into account, as well as taking changing ambient conditions, e.g. non-steady-state ambient conditions, and non-uniform conditions into account.

Several mathematical and empirical thermal-electrical photovoltaic module models have been developed. These models mostly cover steady-state losses, and often the losses due to non-steady-state conditions and/or non-uniform illumination cannot be addressed by such methods, e.g. due to a limited time granularity and due to particular assumptions made, such as for example a uniform module temperature.

Field measurements and indoor wind tunnel experiments on photovoltaic systems show that there may exist significant inter-module and intra-module temperature differences, e.g. under typical operating conditions. Such temperature differences may for example be caused by spatial variations in forced convection and/or differences in illumination intensity, and may also be influenced by the module mounting method and location, and the electrical operation point of the cells or modules. In non-ideal site locations the module efficiency may be reduced by partial shading losses. Dynamic conditions caused by time-dependent effects, such as the effect of clouds or wind cooling effects, may also have an impact on the energy yield. Furthermore, local variations in illumination and/or temperature, e.g. comprising temporal and/or spatial variations, can cause mismatches between cells connected in series, which may be particularly detrimental for achieving a high yield efficiency.

In "Optical-Thermal-Electrical model for a single cell PV module in non-steady-state and non-uniform conditions build in SPICE", *Proceedings of the 28th EU PVSEC*, 2013, page 3291, H. Goverde et al describe an optical-thermal-electrical model for a photovoltaic module that incorporates optical, thermal and electrical aspects and that is suitable for simulating non-steady-state conditions. The disclosed model relates to the simulation of a single cell module, i.e. for a module comprising a single photovoltaic cell. This model is built in SPICE, and is constructed by coupling two equivalent circuits, one circuit describing the electrical behaviour of the single cell module and the other circuit describing the thermal behaviour of the single cell module. Model parameters for the optical, thermal and electrical behaviour are determined from experimental data. However, as the model relates to a single cell module, intra-module differences and intra-module losses are not taken into account.

SUMMARY OF THE DISCLOSURE

Aspects of the present disclosure are configured to accurately calculate a performance of a photovoltaic module, e.g. to accurately calculate optical, thermal and electrical characteristics of photovoltaic modules during non-steady-state and non-uniform operating conditions, thus allowing to calculate the effect of spatial and temporal variations in the operating conditions on the performance of a photovoltaic module or photovoltaic system. For example, accurately calculating these characteristics may refer to a root-mean-square deviation lower than 5%, preferably lower than 2%, for example about 1%. Particularly, such accurate calculations may comprise a computer-implemented simulation of a photovoltaic module comprising a plurality of solar cells.

The above aspect is accomplished by a method and device according to embodiments of the present disclosure.

Calculating the effect of spatial variations may for example comprise calculating the effect of variations between different cells, e.g. differences from cell to cell, within a module. Such variations or differences between cells may result from non-uniform operating conditions such as for example non-uniform illumination of the module or non-uniform wind speed over the module. The calculations may for example be done with a spatial resolution of 5 cm to 50 cm, e.g. 5 cm to 20 cm, e.g. 10 cm, in accordance with the size of the photovoltaic cells within the module.

Calculating the effect of temporal variations may comprise calculating the characteristics of the photovoltaic module within subsequent time intervals having a duration of for example 1 to 5 seconds, e.g. 1 to 3 seconds, e.g. 1 second.

The method of the present disclosure may advantageously be used for accurate short-term (e.g. hourly or daily) and long-term (e.g. annual) energy yield calculations or energy yield predictions of photovoltaic modules or systems and for energy yield optimization.

The method of the present disclosure may be used to evaluate inter-module and intra-module energy losses.

In a first aspect, the present disclosure relates to a method for calculating a performance (such as for example an energy yield or an electrical output energy) of a photovoltaic module that comprises at least a first photovoltaic cell and a second, e.g. neighboring, photovoltaic cell. The method includes using a first thermal equivalent circuit of the first photovoltaic cell and a second thermal equivalent circuit of the second photovoltaic cell, wherein at least one node of the first thermal equivalent circuit is connected to a corresponding node of the second thermal equivalent circuit by a thermal coupling resistance.

The method may comprise calculating a heat flow between the first photovoltaic cell and the second photovoltaic cell using the first thermal equivalent circuit of the first photovoltaic cell and the second thermal equivalent circuit of the second photovoltaic cell.

The method according to embodiments of the present disclosure may comprise calculating the performance, in which this performance comprises an energy yield or an electrical output energy of the photovoltaic module, and in which the step of calculating of the performance is taking the calculated heat flow into account.

In a method according to embodiments of the present disclosure, the at least one node of the first thermal equivalent circuit may be connected by a thermal coupling resistance to a corresponding node of the thermal equivalent circuit of each neighboring photovoltaic cell. For example, when the photovoltaic cells in a photovoltaic module are arranged in a two-dimensional array (matrix), e.g. of rectangular elements, the at least one node of the first thermal equivalent circuit may be connected by a thermal coupling resistance to a corresponding node of up to four thermal equivalent circuits. For example, when the photovoltaic cells in a photovoltaic module are arranged in a two-dimensional grid of hexagonal elements, the at least one node of the first thermal equivalent circuit may be connected by a thermal coupling resistance to a corresponding node of up to six thermal equivalent circuits. Furthermore, in a method according to embodiments of the present disclosure, the at least one node of the first thermal equivalent circuit may be connected by a thermal coupling resistance to a corresponding node of the thermal equivalent circuit of each photovoltaic cell in a local neighborhood of the first photovoltaic cell, e.g. comprising the K nearest neighbors, e.g. in which K can be an small positive integer, e.g. 1, 2, 3, 4, 5, 6, 7, 8, 9, 10, 11, 12, 13, 14, 15 or 16.

In a method according to embodiments of the present disclosure, the thermal coupling resistance may for example have a value representing a thermal resistance of a front side cover layer of the photovoltaic module or a thermal resistance of a front side adhesive layer of the photovoltaic module or a thermal resistance of a rear side adhesive layer of the photovoltaic module or a thermal resistance of a back sheet layer of the photovoltaic module or a thermal resistance of ribbons electrically connecting the first photovoltaic cell with the second photovoltaic cell.

In a method according to embodiments of the present disclosure, a first node of the first thermal equivalent circuit may be connected to a corresponding node of the second thermal equivalent circuit by a first thermal coupling resistance having a value representing a thermal resistance of a front side cover layer of the photovoltaic module and/or a second node of the first thermal equivalent circuit may be connected to a corresponding node of the second thermal equivalent circuit by a second thermal coupling resistance having a value representing a thermal resistance of a front side adhesive layer of the photovoltaic module; and/or a third node of the first thermal equivalent circuit may be connected to a corresponding node of the second thermal equivalent circuit by a third thermal coupling resistance having a value representing a thermal resistance of a rear side adhesive layer of the photovoltaic module and/or a fourth node of the first thermal equivalent circuit may be connected to a corresponding node of the second thermal equivalent circuit by a fourth thermal coupling resistance having a value representing a thermal resistance of a back sheet layer of the photovoltaic module and/or a fifth node of the first thermal equivalent circuit may be connected to a corresponding node of the second thermal equivalent circuit by a fifth thermal coupling resistance having a value representing a thermal resistance of ribbons electrically connecting the first photovoltaic cell with the second photovoltaic cell.

A method according to embodiments of the present disclosure may further comprise: obtaining a first thermal energy value generated in the first photovoltaic cell within a predetermined time interval; providing the first thermal energy value as an input to the first thermal equivalent circuit; obtaining a second thermal energy value generated in the second photovoltaic cell within the predetermined time interval; providing the second thermal energy value as an input to the second thermal equivalent circuit; calculating an internal heat flow value between the first photovoltaic cell and the second photovoltaic cell within the module, taking into account the at least one thermal coupling resistance value; calculating a first temperature value of the first photovoltaic cell based on the first thermal equivalent circuit; and calculating a second temperature value of the second photovoltaic cell based on the second thermal equivalent circuit.

The predetermined time interval may have a duration of 5 seconds or less, such as for example 1 second, embodiments of the present disclosure not being limited thereto.

In a method according to embodiments of the present disclosure, obtaining the first thermal energy value generated in the first photovoltaic cell and obtaining the second thermal energy value generated in the second photovoltaic cell may comprise: obtaining a first irradiation value of the first photovoltaic cell and obtaining a second irradiation value of the second photovoltaic cell within the predetermined time interval; calculating a first optically absorbed energy value in the first photovoltaic cell resulting from the first irradiation and calculating a second optically absorbed energy value in the second photovoltaic cell resulting from the second irradiation; and calculating the first thermal energy value generated in the first photovoltaic cell resulting from the first optically absorbed energy and calculating the second thermal energy value generated in the second photovoltaic cell resulting from the second optically absorbed energy.

A method according to embodiments of the present disclosure may further comprise: calculating a first photo-generated current value of the first photovoltaic cell taking into account the first optically absorbed energy value and the first temperature value and calculating a second photo-generated current value of the second photovoltaic cell taking into account the second optically absorbed energy value and the second temperature value.

A method according to embodiments of the present disclosure may further comprise electrical modeling. The method may comprise: using a first electrical equivalent circuit of the first photovoltaic cell and a second electrical equivalent circuit of the second photovoltaic cell, wherein an output node of the first electrical equivalent circuit is connected with an output node of the second electrical equivalent circuit by an equivalent resistance having a value representing an electrical resistance of ribbons electrically connecting the first photovoltaic cell with the second photovoltaic cell; and determining a first electrical operation point of the first photovoltaic cell taking into account the first photo-generated current value and the first temperature value; and determining a second electrical operation point of the second photovoltaic cell taking into account the second photo-generated current value and the second temperature value.

In embodiments of the present disclosure, the electrical operation point of the photovoltaic cells may be taken into account when determining the thermal energy generated in the cells. Therefore, in embodiments of the present disclosure, obtaining the first thermal energy value generated in the first photovoltaic cell may further comprise calculating a first electrical energy value generated by the first photovoltaic cell at the first electrical operating point and deducting the first electrical energy value from the first optically absorbed energy value to obtain the first thermal energy value, and obtaining the second thermal energy value generated in the second photovoltaic cell may further comprise calculating a second electrical energy value generated by the second photovoltaic cell at the second electrical operating point and deducting the second electrical energy value from the second optically absorbed energy value to obtain the second thermal energy value.

A method according to embodiments of the present disclosure may further comprise: obtaining an ambient temperature value, a wind velocity value and a wind direction indication; determining within the predetermined time interval a first heat transfer coefficient value for the first photovoltaic cell and a second heat transfer coefficient value for the second photovoltaic cell, taking into account ambient temperature, wind velocity, wind direction and a location of the first photovoltaic cell and the second photovoltaic cell within the module; and providing the first heat transfer coefficient value as an input to the first thermal equivalent circuit and providing the second heat transfer coefficient value as an input to the second thermal equivalent circuit.

A method according to embodiments of the present disclosure may comprise calculating optical, thermal and electrical characteristics of a photovoltaic module or of a photovoltaic system within a predetermined time interval, e.g. within a time interval of less than 5 seconds, such as for example 1 second. A method of the present disclosure may comprise calculating these characteristics sequentially for subsequent time intervals as a function of time, over a predetermined time period such as for example a day, a week, a month or a year, the present disclosure not being limited thereto.

A method according to embodiments of the present disclosure may comprise calculating an electrical energy value generated by a photovoltaic module or a photovoltaic system over a predetermined time period under non-steady-state operating conditions, with a temporal granularity corresponding to the predetermined time interval.

A method according to embodiments of the present disclosure may be used for calculating, optimizing or predicting an electrical energy value generated by a photovoltaic module or a photovoltaic system for a predetermined time period. The calculations may be done as a function of time under non-steady-state operating conditions, with a temporal granularity of for example 5 seconds or less, e.g. 1 second.

Embodiments of the present disclosure also relate to a computer program product comprising computer program code means adapted to calculate a performance of a photovoltaic module according to a method according to embodiments of the present disclosure, when the program is run on a computer.

Embodiments of the present disclosure further relate to a non-transitory computer readable storage medium comprising such a computer program.

The present disclosure further relates to a data simulation and modeling system comprising means for carrying out a method according to embodiments of the present disclosure.

It is an advantage of a method according to embodiments of the present disclosure that an improved accuracy of energy yield calculations and energy yield predictions of photovoltaic modules and photovoltaic systems can be provided, as compared to known solutions.

It is an advantage of a method according to embodiments of the present disclosure that it allows calculating and/or predicting energy yield of photovoltaic modules and photovoltaic systems under non-steady-state and non-uniform conditions.

It is an advantage of a method according to embodiments of the present disclosure the effect of material properties and dimensions (such as e.g. layer thicknesses) on the energy yield of photovoltaic modules can be evaluated using such method. Therefore, the method and tool may also be used for module optimization.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter

The drawings are only schematic and are non-limiting. In the drawings, the size of some of the elements may be exaggerated and not drawn on scale for illustrative purposes.

Any reference signs in the claims shall not be construed as limiting the scope. In the different drawings, the same reference signs refer to the same or analogous elements

DETAILED DESCRIPTION OF ILLUSTRATIVE EMBODIMENTS

The present disclosure will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

In a first aspect, the present disclosure relates to a method for calculating a performance, such as an energy yield or an electrical output energy, of a photovoltaic module comprising at least a first photovoltaic cell and a second photovoltaic cell, e.g. comprising a plurality of photovoltaic cells. This method comprises using a first thermal equivalent circuit of the first photovoltaic cell and a second thermal equivalent circuit of the second photovoltaic cell, e.g. using a plurality of thermal circuits respectively representative of the plurality of photovoltaic cells. At least one node of the first thermal equivalent circuit is connected to a corresponding node of the second thermal equivalent circuit by a thermal coupling resistance. For example, the first photovoltaic cell and the second photovoltaic cell may be neighboring cells.

Thus, the method may be a method for accurately modeling and calculating a performance of a photovoltaic module comprising at least two photovoltaic cells, wherein the method allows taking into account the effect of non-uniform ambient conditions from cell to cell, e.g. different ambient conditions for different cells within the module. Examples of such non-uniform ambient conditions that may be taken into account are non-uniform illumination and non-uniform heat transfer.

Using a method according to embodiments of the present disclosure, internal heat flows between cells within a module may be calculated. Thus, the method according to embodiments of the present disclosure may comprise calculating a heat flow between the first photovoltaic cell and the second photovoltaic cell using a first thermal equivalent circuit of the first photovoltaic cell and a second thermal equivalent circuit of the second photovoltaic cell.

A method according to embodiments of the present disclosure may comprise optical, thermal and electrical modeling of the photovoltaic module. The method may be used for calculating optical, thermal and electrical characteristics of a photovoltaic module under non-uniform ambient conditions. It may be used for calculating the energy yield of a photovoltaic module or system under non-uniform ambient conditions and for non-steady-state operating conditions over a predetermined time period.

An optical-thermal-electrical model used in a method according to embodiments of the present disclosure may include optical, thermal and electrical properties of each photovoltaic cell in a photovoltaic module. The model may be based on two coupled RC equivalent circuits for each photovoltaic cell in the module: a thermal RC equivalent circuit for modeling the thermal characteristics of a photovoltaic cell within the module and an electrical RC equivalent circuit for modeling the electrical characteristics of the photovoltaic cell within the photovoltaic module.

A thermal equivalent circuit may be used for each photovoltaic cell within a module. In a method according to embodiments of the present disclosure, a node of a first thermal RC equivalent circuit of a first photovoltaic cell is connected by a thermal coupling resistance to a corresponding node of a second thermal RC equivalent circuit of a second, e.g. neighboring, photovoltaic cell. Connecting nodes of the thermal equivalent circuits of the photovoltaic cells with a thermal coupling resistance allows calculating intra-module heat flows between the photovoltaic cells.

The thermal RC equivalent circuit may be used to calculate the temperature of a photovoltaic cell within a module. The thermal model used in a method according to embodiments of the present disclosure may incorporate input data related to ambient conditions (such as wind velocity, wind direction, ambient temperature) and heat generation in the cell resulting from optical absorption, and it may take into account convection, conduction and radiation of heat, thermal state (e.g. the temperature of the cell at a moment in time), and the electrical operation point of the cell. The thermal equivalent circuit of a photovoltaic cell may be coupled to its neighboring equivalent circuits, e.g. to the thermal equivalent circuits of its neighboring cells, to allow simulation of cell-to-cell heat conduction within the module.

Parameters of the thermal circuits may be extracted from physical properties and extensive 3D/2D FEM (Finite Element Method) models and experiments. FEM (Finite Element Method), CFD (Computational Fluid Dynamics) models and wind tunnel tests may be used to calibrate the thermal model, both for spatial and temporal effects. Thermal capacitance and resistance values may be extracted from measurements and FEM models.

The electrical RC equivalent circuit may describe the electrical characteristics of a photovoltaic cell within a module. It may for example be based on a one-diode model or on a two-diode model. In a method according to embodiments of the present disclosure, a first electrical RC equivalent circuit of a first photovoltaic cell may be connected to a second electrical RC equivalent circuit of a second, e.g. neighboring, photovoltaic cell by a resistance corresponding to an electrical resistance of ribbons electrically connecting the cells within the module.

Temperature-dependent parameters of the electrical equivalent circuit may be varied in accordance with a photovoltaic cell temperature value as calculated based on the thermal modeling. Other parameters of the electrical equivalent circuit may be extracted, for example, from experiments, such as for example from flash and steady-state current-voltage measurements, or from simulations.

Each photovoltaic cell in a module may be described by a thermal equivalent circuit and by an electrical equivalent circuit, enabling the study of spatial effects and differences from cell to cell within a module. For each photovoltaic cell, the thermal equivalent circuit may be coupled to its electrical equivalent circuit, thus forming a thermal-electrical equivalent circuit or model for each cell. The thermal-electrical equivalent circuit describing the thermal and electrical properties of an individual photovoltaic cell may be coupled to the thermal-electrical equivalent circuit of a neighboring photovoltaic cell within a module. In this way, a thermal-electrical equivalent module circuit may be created for a photovoltaic module. This photovoltaic module model can be used to simulate accurately electrical and thermal module characteristics under non-uniform and non-steady state conditions.

In a further aspect, the present disclosure also relates to a computer program product comprising computer program code means adapted to calculate a performance of a photovoltaic module according to embodiments of the first aspect of the present disclosure, when that program is run on a computer.

The present disclosure also relates to a non-transitory computer readable storage medium comprising a computer program product according to embodiments of the present disclosure. For example, the computer readable medium may be a computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, a tangible storage device, or other article of manufacture, for example.

The present disclosure also relates to a data simulation and modeling system comprising means for carrying out a method according to embodiments of the first aspect of the present disclosure.

Figure 1:
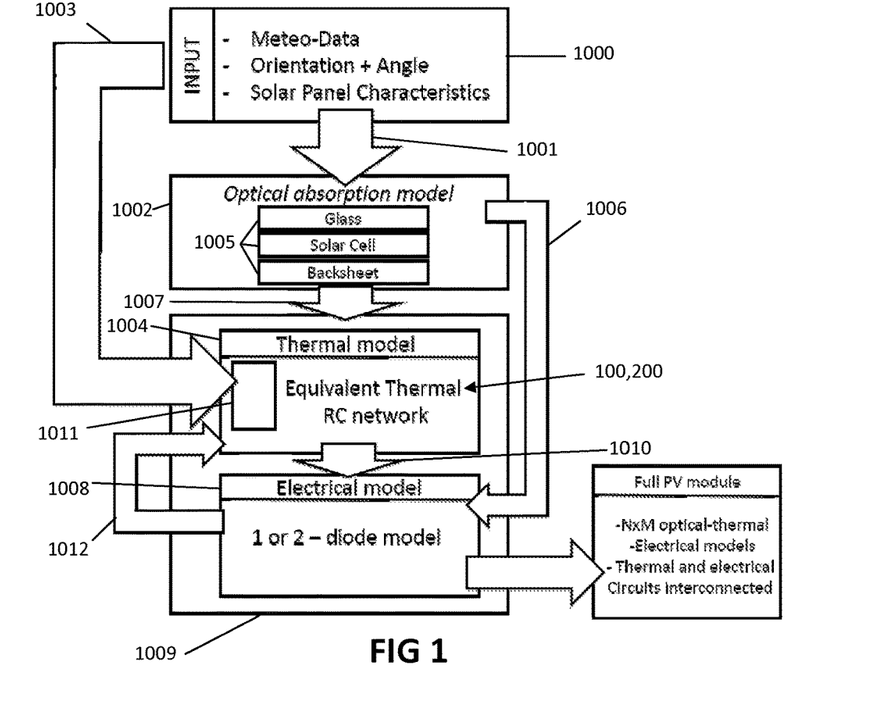
FIG. 1 shows a schematic overview of an optical-thermal-electrical modeling method in accordance with embodiments of the present disclosure.

FIG. 1 shows a schematic overview of an example method in accordance with embodiments of the present disclosure, e.g. an electro-thermal-optical modeling method in accordance with embodiments of the present disclosure.

Data used as an input for the calculations may include information related to ambient conditions 1000, such as meteorological data, and information related to the orientation and the angle of the photovoltaic module. In addition, information related to the way the module is mounted may be included. The information related to ambient conditions 1000 may include data related to in-plane or global horizontal irradiance values (e.g. both direct and diffuse; e.g. predicted or measured), ambient temperature (e.g. as can be measured in the shade), uniform free wind speed and wind direction. Preferably, these data may be provided with fine grain temporal resolution, such as for example with a resolution of 1 to 5 seconds, preferably 1 second, to enable high resolution energy yield predictions, e.g. with a root-mean-square deviation lower than 5%, preferably lower than 2%, for example 1%. If only global horizontal irradiance data are available, the in-plane irradiation values may be calculated using the solar elevation and the system configuration, e.g. the orientation and the tilt angle of the photovoltaic module. The in-plane irradiation data 1001 (for example in W/m$^2$) or spectral irradiation data, e.g. for the full spectrum, may be used as an input to the optical absorption model 1002, and the information 1003 relating to ambient temperature value (e.g. in K) and wind characteristics, e.g. uniform wind velocity (e.g. in m/s) and/or wind direction, may be taken into account in the thermal modelling 1004.

Absorption, transmission and reflection values of irradiation energy may be calculated in each material layer 1005 of the photovoltaic module, e.g. using a layer-by-layer optical absorption model. The optical modelling may be split into two phases, e.g. to reduce computational time and to achieve convergence. The first phase may involve calculating absorption, transmission and reflection values of the environment, the cover layer (e.g. glass layer) covering the photovoltaic cells, and the adhesive layer between the cover layer and the photovoltaic cells. This part may be modeled using classical optical absorption and transmission approaches. The second phase of the optical modeling may relate to the photovoltaic cell, with for example a textured surface, antireflection coating, doping profiles, reflective back side, metal contacts, etc. The dimensions of the different features in this second part may be a few orders of magnitude smaller than the dimensions in the first part. The second part may be modeled using ray tracing methods. This may involve calculating absorption, transmission and reflection values, and it may further involve calculating the photo-generated current value 1006 (e.g. in A/m$^2$) and the generated heat value 1007 (thermal energy value, e.g. in W/m$^2$).

Such two-phase approach may allow a significant reduction of the required computation time as compared to a method in which ray tracing is used for the entire structure including, for example, the glass cover, while maintaining a high accuracy (e.g. with a root-mean-square deviation lower than 5%, preferably lower than 2%, for example 1%) and the ability to model the behavior of each photovoltaic cell in a module in detail.

The optical model may take into account the physical dimensions of the photovoltaic cells and module (such as for example the lateral dimensions of metal contacts, thickness of the different layers in the cell and module, and the like) as well as the optical properties (wavelength dependent refractive index (n) and extinction coefficient (k) values) of each element in the cell and module. The optical calculations may comprise calculating the absorbed, transmitted and reflected energy values for each layer, depending on wavelength and illumination angle, by using the physical dimensions and the n and k values of the different materials. In a method of the present disclosure, the wavelength dependent absorption and reflection values are integrated over the entire solar spectrum in order to express the absorbed energy value in each layer as a percentage of the total in-plane irradiance value. The optical calculations further may comprise calculating the generated thermal energy value in the photovoltaic cell resulting from the light absorption (optical absorption), and calculating the number of generated electron-hole pairs and the photo-generated current value using ray-tracing software. The photo-generated current value of a cell may for example be calculated at its MPP (Maximum Power Point) or it may be calculated taking into account an electrical load.

The generated thermal energy value 1007 calculated using the optical absorption model 1002 may be used as an input parameter to the thermal model 1004, and the photo-generated current value 1006 calculated using the optical absorption model 1002 may be used as an input parameter to the electrical model 1008.

Since the absorption model 1002 may be based on the detailed physical dimensions and optical properties of a photovoltaic cell and module, the optical model can be adapted to simulate the optical behavior of any photovoltaic module, e.g. as long as optical property data (wavelength dependent n and k values) are available and the physical dimensions are known.

It is known that the electrical characteristics of a photovoltaic cell or a photovoltaic module depend on the cell or module temperature. Therefore, modelling of the thermal behavior of a photovoltaic module, e.g. the evolution of the module temperature over time, can be important to obtain an accurate energy yield prediction.

Thermal energy can be generated in the photovoltaic structure by the absorption of solar energy. In a method in accordance with embodiments of the present disclosure, the absorbed energy values in the different layers of the module may be calculated using the optical absorption model 1002 described above. These absorbed energy values are used as an input to the thermal model 1004 as further described.

In a thermal model 1004 in accordance with embodiments of the present disclosure, three types of heat loss mechanisms may be taken into account: conductive losses, convective losses and radiative losses. In a photovoltaic module, the generated heat (e.g. resulting from light absorption) can for example flow from a photovoltaic cell to a surface of the module, laterally within a module, i.e. in a plane of the module, (e.g. during non-uniform illumination), or from the module to e.g. a supporting structure (conductive losses). Heat can also be removed by free and/or forced convection (e.g. due to wind effects), and by long-wave radiation to the environment. The thermal response is also influenced by the electrical operating point of the cell or module. All these mechanisms can be covered, e.g. in a single simulation, by the thermal model in accordance with embodiments of the present disclosure.

The thermal response of a structure may be determined by its thermal properties (e.g. thermal resistance and capacity) and its thermal state. Therefore, to be able to simulate or calculate energy yield values of a photovoltaic module during non-steady state and non-uniform conditions, and since the module temperature is influenced by the thermal mass and previous events, a state-dependent simulation tool may be used in a method in accordance with embodiments of the present disclosure, to accurately model the electrical and thermal characteristics of the photovoltaic module.

For this energy yield modeling tool, 3D FEM thermal models can be developed and, for example, validated by measurements. Such calibrated models can be used to investigate transient and spatial variations of the photovoltaic module temperature. Validated FEM models may thus be used to extract time constants for thermal equivalent circuits 100,200 in accordance with embodiments of the present disclosure. By building 3D FEM models and extracting parameters for the thermal equivalent circuit, a high accuracy can be maintained while advantageously reducing computational time. The resulting thermal RC equivalent circuits 100,200 may then be used to calculate the temperature value $T_{cell}$ 1010 of each photovoltaic cell in a photovoltaic module under non-steady state and non-uniform conditions.

Figure 2:
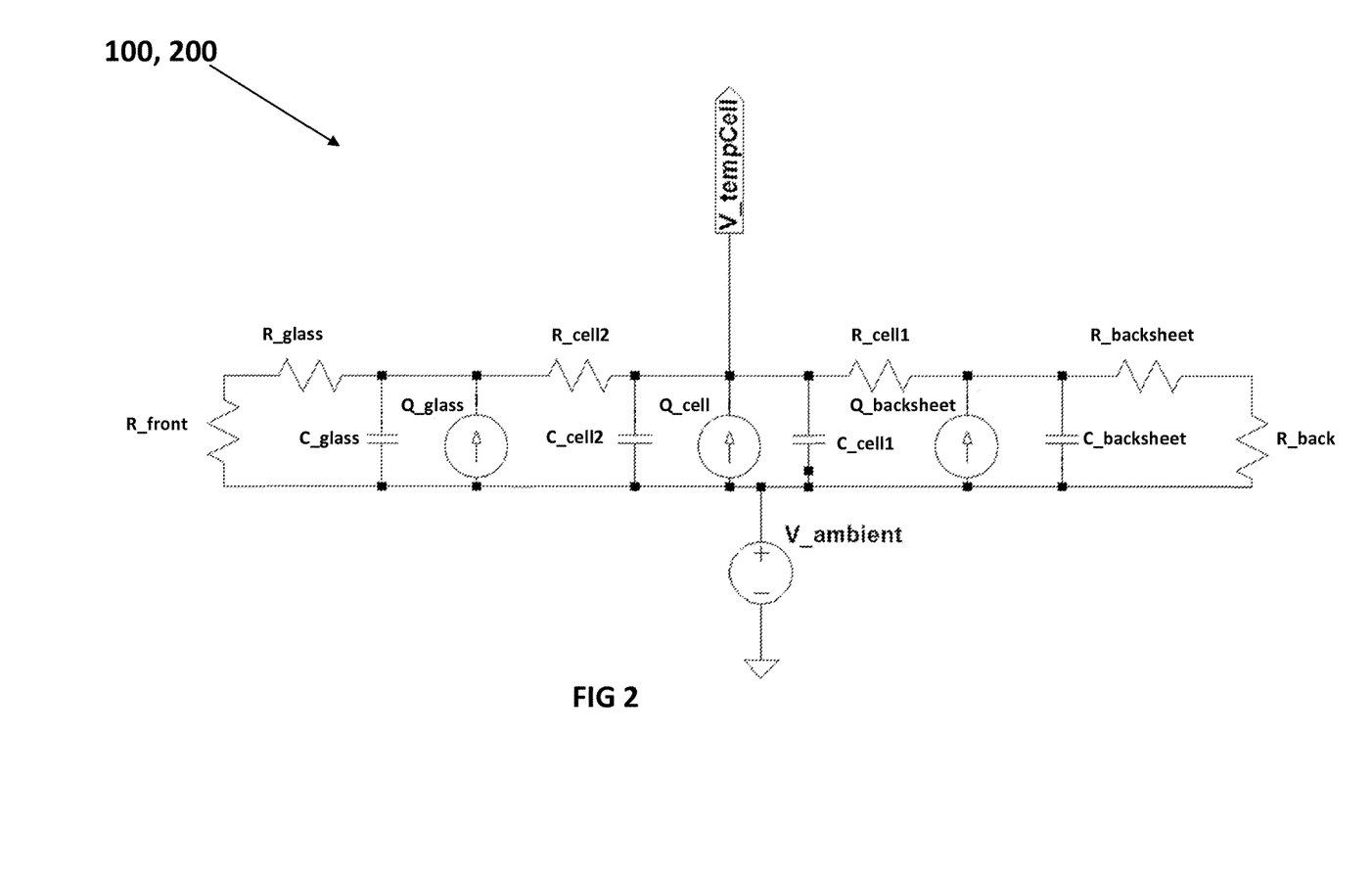
FIG. 2 shows an example of a thermal RC equivalent circuit of a single cell photovoltaic module, to illustrate aspects of embodiments of the present disclosure.

The thermal response of a photovoltaic cell can be calculated using a thermal equivalent circuit 100,200 as for example shown in FIG. 2. FIG. 2 shows the Cauer network of a single photovoltaic cell 1, 2 in a module 10. In this example circuit, R_"element" and C_"element" represent respectively thermal resistances and thermal capacitances of the corresponding "elements", for example glass, backsheet, or cell. The current sources Q_glass, Q_cell and Q_backsheet in the thermal equivalent circuit correspond to the fraction of thermal energy absorbed in the corresponding structure, e.g. as can be deduced from the optical absorption model, multiplied with the illumination level, e.g. irradiance values. The front resistance R_front and the back resistance R_back represent the convection, e.g. dependent on a heat transfer coefficient, and radiation of heat from the front and rear side of the module. Thus, the thermal model 1004 may use a thermal equivalent circuit 100,200 that takes a heat transfer model 1011 into account. V_ambient corresponds to the ambient temperature, and V_tempcell corresponds to the photovoltaic cell temperature. In a method in accordance with embodiments of the present disclosure, a uniform cell temperature may be assumed.

Figure 3:
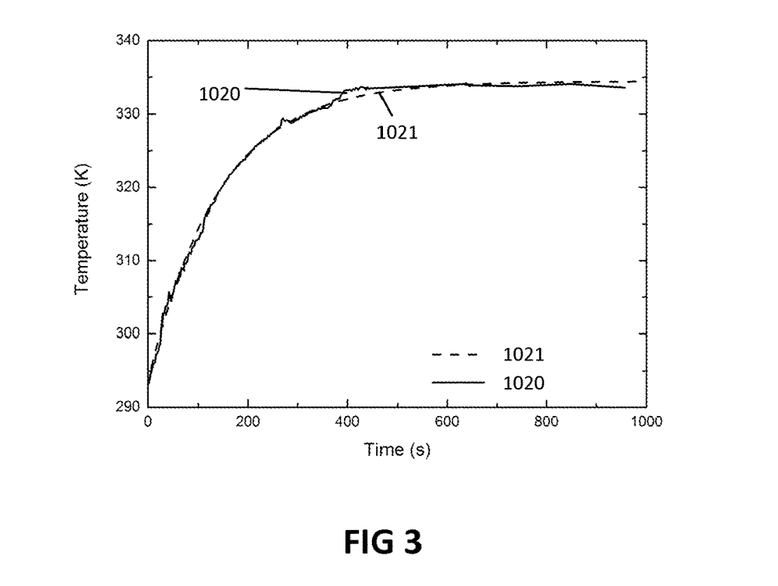
FIG. 3 shows a measured and simulated thermal response of a single cell photovoltaic module, to illustrate aspects of embodiments of the present disclosure.

One way to determine the values of the thermal capacitors and resistors is to use the physical values of each layer in the structure, taking into account the physical dimensions of each element, its thermal capacity and thermal conductivity. The thermal constants can also be extracted from a measured thermal response of a physical photovoltaic module. For example, FIG. 3 shows a measured thermal response 1020 of a single cell module, illuminated at 1.5AM (e.g. assuming no wind and constant ambient temperature), and the corresponding simulated response 1021 using the Cauer circuit illustrated in FIG. 2 with the physical values for this module. From the results shown in FIG. 3, it can be seen that the thermal response of a single photovoltaic cell can be accurately modelled using the Cauer network of FIG. 2.

It is an advantage of a method according to embodiments of the present disclosure that it allows fast calculations, such as e.g. 100 times faster than real-time, with good accuracy, e.g. with a root-mean-square deviation lower than 5%, preferably lower than 2%, for example 1%. It is an additional advantage of this method that it can be used to investigate the effect of changing structural properties or materials (e.g. thinner glass, or an adhesive layer with a higher thermal conductivity) on the thermal response of a photovoltaic module.

Electron-hole pairs that are generated in the photovoltaic cell as a result of the optical absorption can either be collected at the cell contacts and used in the form of electrical energy, or they can recombine again and lose their energy, e.g. in the form of heat (thermal energy), thus influencing the thermal response. To take this effect into account in the thermal modeling 1004, the value of the electrical energy generated by a photovoltaic cell may be calculated and this amount of energy (which may be extracted from the cell in the form of electricity) may be subtracted from the absorbed energy value, to obtain the value of the thermal energy generated in the photovoltaic cell. For example, as shown in FIG. 1, in a method in accordance with embodiments of the present disclosure, a power dissipation (e.g. in W) 1012 may be calculated in the electrical model 1008 and provided as input to the thermal model, e.g. as input in a next simulation cycle.

Another loss mechanism that may affect the thermal response is the radiation of heat from the surfaces of the structure. Especially during low wind speed conditions, the cooling of photovoltaic modules may be dominated by long-wave radiation. The radiation of heat can be expressed by the relation: $P_{radiation} = \varepsilon \sigma (T_h^4 - T_c^4) A$.

In this expression, $\varepsilon$ is the emissivity value (for example, between 0.85 and 0.95 for glass), $T_h$ is the temperature of the hot body, e.g. in this case the glass temperature, $T_c$ is the temperature of the cold body (e.g. sky temperature), $\sigma$ is the Boltzmann constant and A is the area of the hot body. In a method according to embodiments of the present disclosure, radiation of heat may be incorporated in the thermal equivalent model by calculating the surface temperatures from the thermal circuit, taking into account the ambient temperature and using the equation shown above.

Another mechanism that may influence the thermal response of a body is the convection of heat from its surfaces. The convection of heat can be calculated using the expression: $P_{convective} = h \Delta T A$ In this expression: h is the heat transfer coefficient, $\Delta T$ the temperature difference between the hot body (e.g. the surface of the module) and the environment, and A is the module area.

Figure 4:
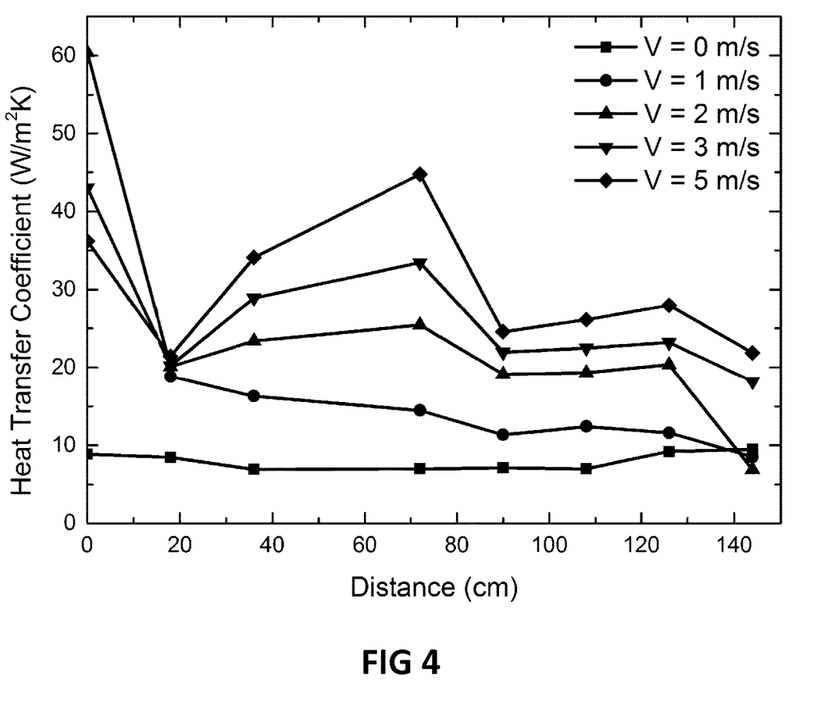
FIG. 4 shows location-dependent heat transfer coefficient values as a function of the distance from an edge of a photovoltaic module, for different uniform wind speeds, as extracted from wind tunnel experiments, to illustrate aspects of embodiments of the present disclosure.

The value of the heat transfer coefficient h can be expressed as a function of the (wind) flow velocity and characteristics (laminar/turbulent). Determining the heat transfer coefficient value analytically can be difficult. Spatial variations of the heat transfer coefficient value are usually present. Such variations may be related to the transportation of air (having a temperature that may be different from the module temperature) from one end of the module to another end of the module and to a decrease of wind speed over the module. In order to incorporate the effect of the wind on the photovoltaic module performance, 2D FEM CFD models of a photovoltaic module in a uniform wind field may be built, e.g. in COMSOL, and wind tunnel experiments may be performed on illuminated photovoltaic modules to extract location-dependent heat transfer coefficient values for different uniform wind speeds. An example of the results of such wind tunnel experiments is shown in FIG. 4. In this example, the wind direction was parallel to the photovoltaic module surface. FIG. 4 shows location-dependent heat transfer coefficient values as a function of the distance from an edge of a photovoltaic module, as extracted from wind tunnel experiments. The edge (distance=0 cm) corresponds to the side of the module closest to the origin of the wind flow. These results show that heat transfer coefficient differences may be present within a module due to the wind flow. Such wind tunnel experiments can be used to extract relations between the global uniform wind speed and the local heat transfer coefficient.

Figure 5:
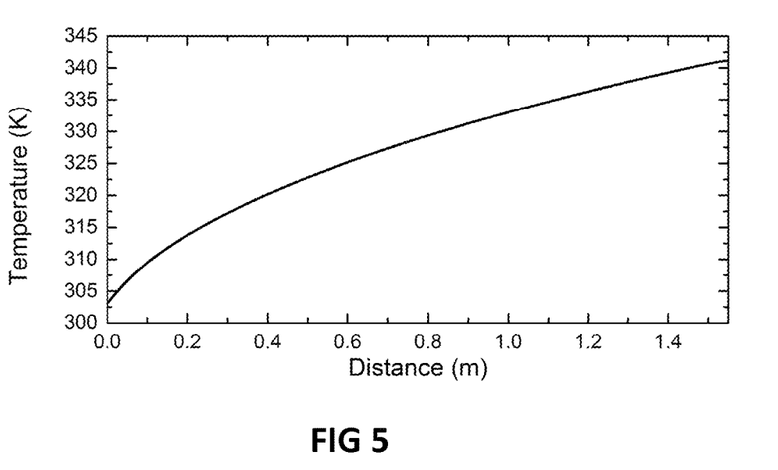
FIG. 5 shows a calculated location-dependent glass temperature as a function of the distance from an edge of a photovoltaic module for an illuminated (1000 W/m2) module in a wind field with a uniform wind speed of 10 m/s, to illustrate aspects of embodiments of the present disclosure.

FIG. 5 shows example simulated glass temperature values along the surface of an illuminated module in a wind field with a uniform wind speed of 10 m/s. The temperature profile results from the transportation of hot air from one end of the module to an opposite end of the module (leading to an increase in temperature) and from a decrease of wind speed over the module.

Such validated FEM CFD model, e.g. as demonstrated by this example, may be used to extract angular, wind speed dependent and spatially resolved heat transfer coefficient values. These local and wind speed dependent heat transfer coefficient values may then be used to calculate the thermal resistance value of the front and back resistor in a thermal equivalent circuit of the photovoltaic cells in a method in accordance with embodiments of the present disclosure, e.g. R_front and R_back in FIG. 2, thus incorporating the effect of spatially resolved convective losses in the thermal modeling, e.g. differences from cell to cell in these convective losses. The value of the heat transfer coefficients in the thermal equivalent circuit can vary over time, depending on the location, wind speed and direction.

The example thermal equivalent circuit as described above, and as shown in FIG. 2, may be used in accordance with embodiments of the present disclosure to describe and simulate the thermal response of each single photovoltaic cell within a module. However, photovoltaic modules typically consist of a plurality of photovoltaic cells, which are thermally connected by e.g. a glass plate, a back sheet, ribbons and/or adhesive layers, allowing the conduction of heat from one cell to another cell within a module. Therefore, a method in accordance with embodiments of the present disclosure may be adapted for taking such thermal connection between individual cells explicitly into account.

Figure 6:
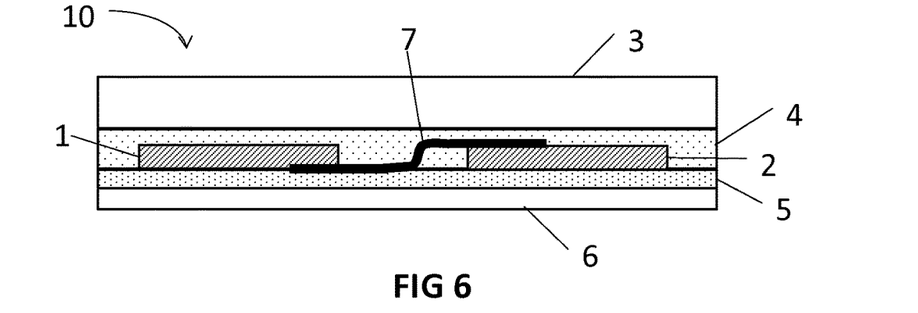
FIG. 6 schematically shows a cross section of a photovoltaic module, showing two photovoltaic cells and showing different layers by which the cells may be thermally connected, to illustrate aspects of embodiments of the present disclosure.

FIG. 6 schematically shows a cross section of a photovoltaic module 10, showing a first photovoltaic cell 1 and a second, neighboring, photovoltaic cell 2 electrically connected by a ribbon 7. In the example shown, the first photovoltaic cell 1 and the second photovoltaic cell 2 are provided between a front cover layer 3, for example, a glass plate, and a back sheet layer 6. The module 10 further comprises a front side adhesive layer 4 between the photovoltaic cells 1, 2 and the front cover layer 3 and a rear side adhesive layer 5 between the photovoltaic cells 1, 2 and the back sheet layer 6. In a structure as shown in FIG. 6, lateral heat conduction may occur between the first photovoltaic cell 1 and the second photovoltaic cell 2, i.e. thermal energy may flow within the module between the neighboring cells. This flow of thermal energy may occur through the different materials by which the first photovoltaic cell 1 and the second photovoltaic cell 2 are thermally connected, for example through the front cover layer 3, the front side adhesive layer 4, the rear side adhesive layer 5, the back sheet layer 6 and the ribbon 7. In a method in accordance with embodiments of the present disclosure, the effect of such intra-module heat (thermal energy) conduction can be taken into account.

The conduction of thermal energy within a photovoltaic module may be studied by building a 3D thermal FEM model. Such FEM model may be calibrated using steady-state temperature measurements. The heat transfer within the module (internal heat flow) can be studied by illuminating a single cell within a module and investigating the heat flow towards other cells in a single element or layer (such as for example glass, EVA, ribbons, backsheet) of the photovoltaic module.

Figure 7:
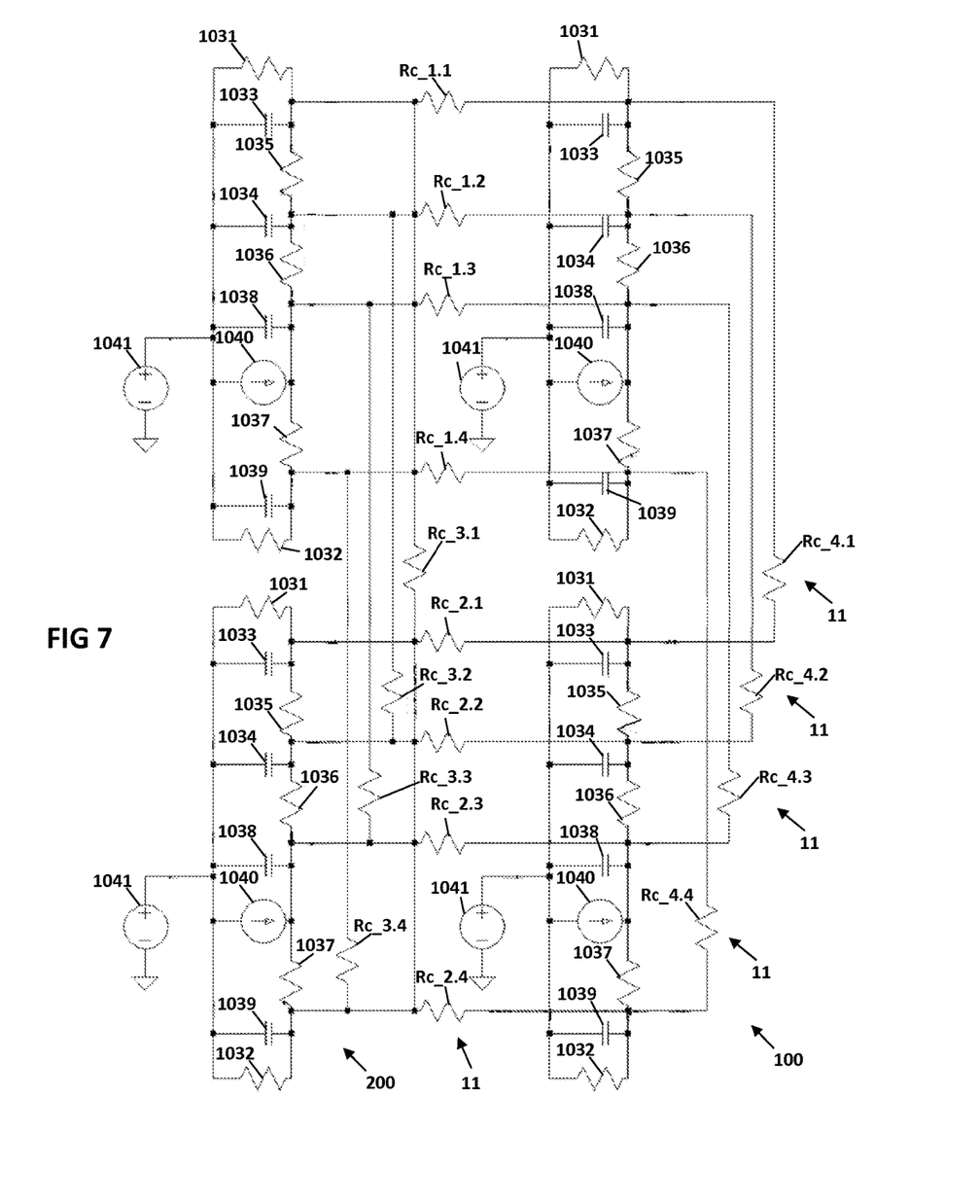
FIG. 7 shows a schematic overview of a 2 cell×2 cell thermal RC equivalent model that may be used in a method in accordance with embodiments of the present disclosure.

The conduction of thermal energy within a photovoltaic module is incorporated into the thermal model of the present disclosure by thermally coupling at least one layer of a single cell in a photovoltaic module to the corresponding layer of each neighboring photovoltaic cell that is thermally connected to the single cell by that layer. As an example, FIG. 7 shows a coupled thermal equivalent network of a photovoltaic module comprising four cells, organized in two rows of two cells. In the example network shown in FIG. 7, several layers (corresponding to a circuit node) of a photovoltaic cell are thermally connected to the corresponding layer (corresponding circuit node) of a neighboring photovoltaic cell by a thermal coupling resistor 11 having a thermal coupling resistance Rc_x.y, for the layers y through which thermal energy conduction between the photovoltaic cells may occur. These thermal coupling resistances 11 may have values derived from the 3D thermal FEM modeling of internal heat flows within a photovoltaic module, as described above. In the example shown in FIG. 7, Rc_x.1 represents a thermal coupling resistance of the front side cover layer 3 of the photovoltaic module 10; Rc_x.2 represents a thermal coupling resistance of a front side adhesive layer 4 of the photovoltaic module 10; Rc_x.3 represents a thermal coupling resistance of ribbons 7 of the photovoltaic module 10; and Rc_x.4 represents a thermal resistance of the rear adhesive layer 5 and the back sheet layer 6 of the photovoltaic module 10.

This example coupled thermal equivalent network may for example comprise: a thermal resistor 1031 representative of front-side convection (e.g. Rth_convection_front), a thermal resistor 1032 representative of back-side convection (Rth_convection_back), a thermal capacitor 1033 of the glass layer (C_th_glass), a thermal capacitor 1034 formed by the silicon and the front-side (Cth_silicone_front), a thermal resistor 1035 between the glass and the front side adhesive layer (Rth_silicone_glass), a thermal resistor 1036 between the solar cell and the front side adhesive layer (Rth_solar_cell_silicone_front), a thermal resistor 1037 between the solar cell and the rear side adhesive layer (Rth_solar_cell_silicone_back), a thermal capacitor 1038 of the solar cell (Cth_solar_cell), a thermal capacitor 1039 of the rear side adhesive layer (Cth_silicone_back), a thermal 'current' source 1040 and/or a thermal 'voltage' source 1041 representative of an ambient temperature (Vth_ambient_temp).

Furthermore, the thermal response of a photovoltaic module may be influenced by the electrical operation point of the module. Therefore, the electrical output of the electrical circuit may be calculated and the electrical output energy value may be deducted from the absorbed energy value to determine the thermal energy value generated in the photovoltaic cell. This thermal energy value is used as an input to the thermal equivalent circuit.

An electrical equivalent model used in a method in accordance with embodiments of the present disclosure may for example comprise, e.g. may consist of, a one-diode model or a two-diode model as known by a person skilled in the art, in which the diode temperature value and the dark-saturation current value may be adapted according to the photovoltaic cell temperature.

For the one-diode model, the dark-saturation current $I_0$ may be adapted depending on the photovoltaic cell temperature T based on: $I_0 = CT^3 \exp(-E_g/kT)$ In this expression, C is a temperature independent constant and $E_g$ is the band gap of the semiconductor (e.g. silicon), which may be given by: $E_g = E_g(0) - \alpha T^2/(T+\beta)$ Here, $E_g(0)$ is equal to the band gap at T=0 K and $\alpha$ and $\beta$ are material constants (e.g. $7.02 \times 10^{-4}$ eVK$^{-1}$ and 1108 K respectively for silicon).

The equations above show that the dark saturation current value can depend on several known material and elementary constants, the photovoltaic cell operation temperature value and a temperature independent constant.

The photo-generated current value $I_{ph}$ may be calculated using the incident light intensity value (irradiation) and the values of C, the diode ideality factor n, the series resistance value $R_s$ and the shunt resistance value $R_{shunt}$ of the diode model. $R_s$ and $R_{shunt}$ values can be extracted by measuring current-voltage characteristics of the photovoltaic cell or of the photovoltaic module at a known temperature.

In a method in accordance with embodiments of the present disclosure, the electrical equivalent circuit of a photovoltaic cell in the module may be coupled to its thermal equivalent circuit.

Using the fitted parameters of the diode model and the photovoltaic cell temperature value (which may be determined from thermal calculations based on the thermal equivalent circuit) as an input to the electrical equivalent circuit, all the electrical properties of each individual cell within a module can be calculated.

By connecting the electrical equivalent circuit of a single photovoltaic cell to the electrical equivalent circuits of other cells, e.g. the neighboring cells, a full photovoltaic module can be modeled.

In a method in accordance with embodiments of the present disclosure, for each photovoltaic cell within a module a thermal equivalent circuit and an electrical equivalent circuit may be provided and coupled to each other. The thermal equivalent circuit of each photovoltaic cell in the module may be thermally coupled to the thermal equivalent circuit of its neighboring cells as illustrated in FIG. 7. Furthermore, the electrical equivalent circuit of each photovoltaic cell in the module may be electrically coupled to the electrical equivalent circuit of the neighboring cells to which the photovoltaic cell is electrically connected e.g. by a ribbon or by ribbons, the present disclosure not being limited thereto.

Figure 8:
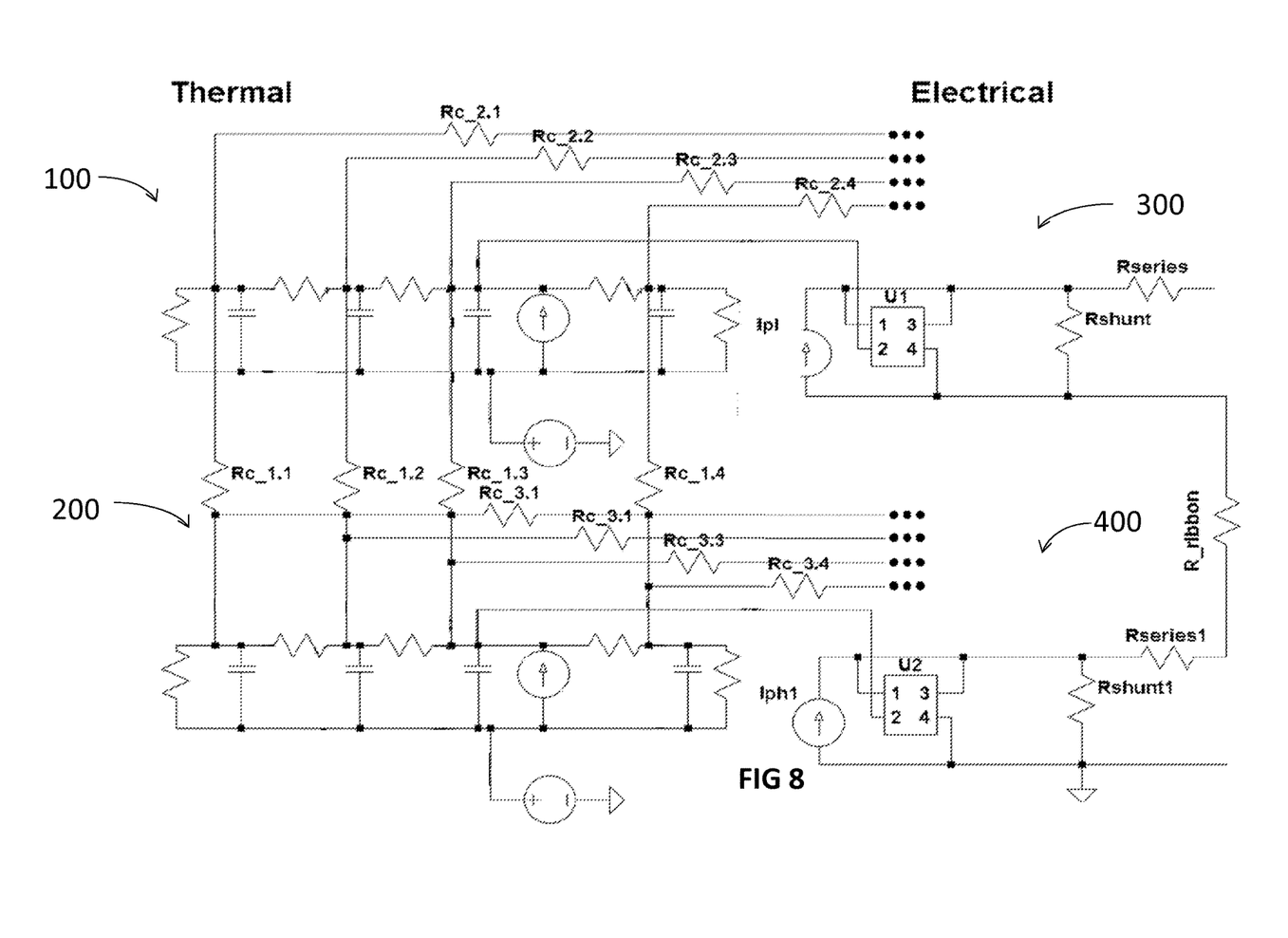
FIG. 8 shows a schematic overview of a thermal-electrical model for a photovoltaic module with two photovoltaic cells that may be used in a method in accordance with embodiments of the present disclosure.

FIG. 8 shows an example of such a thermal-electrical model of a photovoltaic module with two cells. This example circuit shows the thermal equivalent circuits 100, 200 of two cells alongside the electrical equivalent circuits 300, 400. Components of the thermal equivalent circuits 100, 200 may correspond to those illustrated in FIG. 2 and/or FIG. 7, as shall be clear to the person skilled in the art. The electrical equivalent circuits 300, 400 of the cells may be coupled by an equivalent resistance R_ribbon corresponding to the electrical resistance of the connecting ribbons. Further, by-pass diodes may be included to complete the model of the photovoltaic module. A perturb and observe maximum-power-point tracker may also be incorporated into the model. For example, parameters of the MMPT algorithm can be changed to investigate the influence on energy yield.

Such a thermal-electrical model 1009, e.g. as illustrated by the example in FIG. 8, may be coupled to an optical model 1002, e.g. as schematically illustrated in FIG. 1, and the model can be used for energy yield analyses under non-steady-state and non-uniform conditions.

Figure 9:
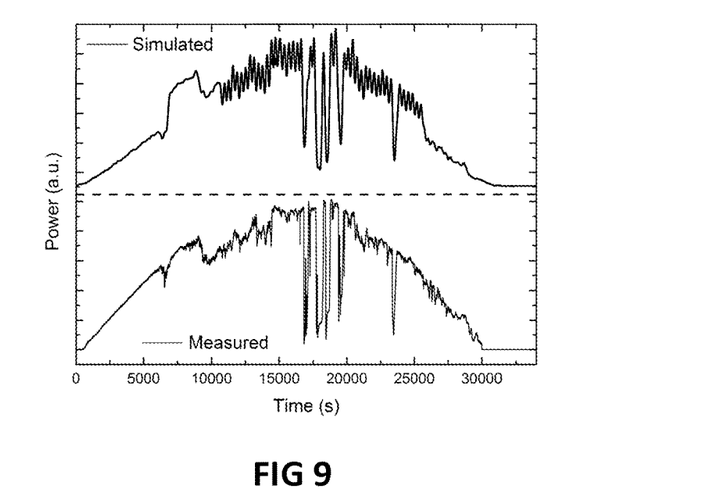
FIG. 9 shows a simulated and measured electrical power generated by a commercial photovoltaic module, as a function of time, in which the simulated data are calculated based on a modeling method in accordance with embodiments of the present disclosure.

FIG. 9 shows an example measured electrical power generated by a commercial photovoltaic module as a function of time and the simulated electrical power output, calculated using a method according to embodiments of the present disclosure. FIG. 9 shows that the energy yield predictions based on a model according to the present disclosure follow the fast-varying illumination conditions of the photovoltaic module.

Figure 10:
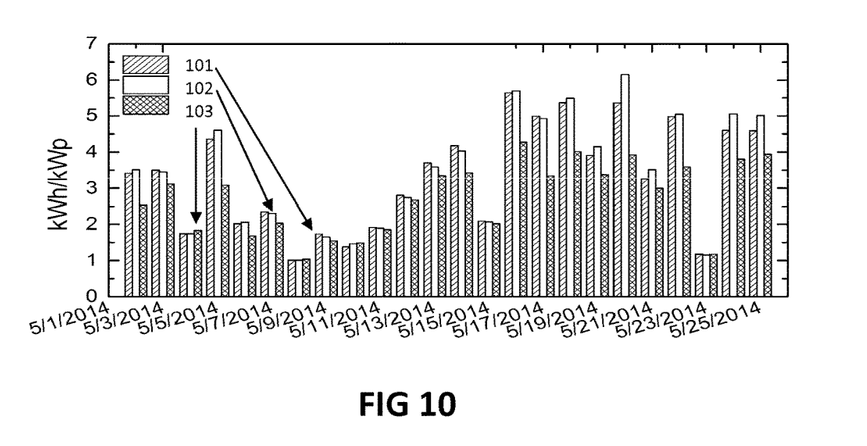
FIG. 10 shows a daily energy yield of a residential photovoltaic system, in which the measured energy yield values are shown, as well as energy yield values calculated with the prior-art method of PVsyst, and energy yield values calculated using a method in accordance with embodiments of the present disclosure.

FIG. 10 shows measured daily energy yields 101 for a residential photovoltaic installation, as well a day-by-day energy yield predictions 103 generated by a commercially available prior art program, PVsyst photovoltaic software. The energy yield predictions 102 obtained by an optical-thermal-electrical modeling method according to embodiments of the present disclosure is also shown.

In this example, the input for the applied model in accordance with embodiments of the present disclosure comprised meteorological data (irradiation, temperature, wind). The simulated outputs may accurately cover all the electrical and thermal values of the module. Finite Element Method (FEM) models, wind tunnel testing and measurement extraction may allow incorporation of conduction, convection and radiation in the thermal part of the simulation. Furthermore, the thermal and the electrical part can be coupled in a way that the effect of temperature on the power production is captured successfully, as supported by indoor and outdoor measurements. Verilog-AMS was used as a simulation platform for this example, which may advantageously allow a substantial exploitation of the capabilities of the model in accordance with embodiments of the present disclosure. For example, speed-ups of 500× relative to real time may be achieved, while at the same time keeping track of temperatures down to the cell detail level and being capable of dealing with partial shading, spatial temperature variations and fast-changing wind conditions.

Validation of the model in accordance with embodiments of the present disclosure was also performed for the residential photovoltaic system over a period of 3 months. Daily energy yields were calculated with an average error of 3.6% and a standard deviation of 2.8%, whereas for the same days PVsyst resulted in an average error of 18% and a standard deviation of 11%. The Root-Mean-Square Error (RMSE) of the results obtained with a method in accordance with embodiments of the present disclosure was 0.368, while PVsyst reported an RMSE of 1.50 for the same period of 3 months, thus showing that a substantial improvement in accuracy can be obtained with a method according to embodiments of the present disclosure, when compared to a prior-art method.

The foregoing description details certain embodiments of the disclosure. It will be appreciated, however, that no matter how detailed the foregoing appears in text, the present disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the disclosure as applied to various embodiments, it will be understood that various omissions, substitutions, and changes in the form and details of the device or process illustrated may be made by those skilled in the technology without departing from the disclosure.

What is claimed is:

1. A method for calculating a performance of a photovoltaic module comprising at least a first photovoltaic cell and a second photovoltaic cell, the method comprising:
    calculating a heat flow between the first photovoltaic cell and the second photovoltaic cell, wherein calculating the heat flow includes using a first thermal equivalent circuit of the first photovoltaic cell and a second thermal equivalent circuit of the second photovoltaic cell, wherein at least one node of the first thermal equivalent circuit is connected to a corresponding node of the second thermal equivalent circuit by a thermal coupling resistance.

2. The method according to claim 1, wherein the performance of the photovoltaic module comprises an energy yield or an electrical output energy of the photovoltaic module, and wherein calculating the performance of the photovoltaic module comprises taking the calculated heat flow into account.

3. The method according to claim 1, wherein the thermal coupling resistance has a value representing at least one of a thermal resistance of a front side cover layer of the photovoltaic module, a thermal resistance of a front side adhesive layer of the photovoltaic module, a thermal resistance of a rear side adhesive layer of the photovoltaic module, a thermal resistance of a back sheet layer of the photovoltaic module, or a thermal resistance of ribbons electrically connecting the first photovoltaic cell with the second photovoltaic cell.

4. The method according to claim 1, wherein at least one of:

a first node of the first thermal equivalent circuit is connected to a corresponding node of the second thermal equivalent circuit by a first thermal coupling resistance having a value representing a thermal resistance of a front side cover layer of the photovoltaic module, a second node of the first thermal equivalent circuit is connected to a corresponding node of the second thermal equivalent circuit by a second thermal coupling resistance having a value representing a thermal resistance of a front side adhesive layer of the photovoltaic module, a third node of the first thermal equivalent circuit is connected to a corresponding node of the second thermal equivalent circuit by a third thermal coupling resistance having a value representing a thermal resistance of a rear side adhesive layer of the photovoltaic module, a fourth node of the first thermal equivalent circuit is connected to a corresponding node of the second thermal equivalent circuit by a fourth thermal coupling resistance having a value representing a thermal resistance of a back sheet layer of the photovoltaic module, or a fifth node of the first thermal equivalent circuit is connected to a corresponding node of the second thermal equivalent circuit by a fifth thermal coupling resistance having a value representing a thermal resistance of ribbons electrically connecting the first photovoltaic cell with the second photovoltaic cell.

5. The method according to claim 1, wherein the method further comprises:

obtaining a first thermal energy value generated in the first photovoltaic cell within a predetermined time interval;

providing the first thermal energy value as an input to the first thermal equivalent circuit;

obtaining a second thermal energy value generated in the second photovoltaic cell within the predetermined time interval;

providing the second thermal energy value as an input to the second thermal equivalent circuit;

calculating an internal heat flow value between the first photovoltaic cell and the second photovoltaic cell within the photovoltaic module, wherein calculating the internal heat flow includes taking into account the thermal coupling resistance;

calculating a first temperature value of the first photovoltaic cell; and calculating a second temperature value of the second photovoltaic cell.

6. The method according to claim 5, wherein obtaining the first thermal energy value generated in the first photovoltaic cell and obtaining the second thermal energy value generated in the second photovoltaic cell comprise:

obtaining a first irradiation value of the first photovoltaic cell and a second irradiation value of the second photovoltaic cell within the predetermined time interval;

calculating a first optically absorbed energy value in the first photovoltaic cell resulting from the first irradiation value and calculating a second optically absorbed energy value in the second photovoltaic cell resulting from the second irradiation value; and calculating the first thermal energy value generated in the first photovoltaic cell resulting from the first optically absorbed energy value and calculating the second thermal energy value generated in the second photovoltaic cell resulting from the second optically absorbed energy value.

7. The method according to claim 6, further comprising:

calculating a first photo-generated current value of the first photovoltaic cell, wherein calculating the first photo-generated current value includes taking into account the first optically absorbed energy value and the first temperature value; and calculating a second photo-generated current value of the second photovoltaic cell, wherein calculating the second photo-generated current value includes taking into account the second optically absorbed energy value and the second temperature value.

8. The method according to claim 7, further comprising:

using a first electrical equivalent circuit of the first photovoltaic cell and a second electrical equivalent circuit of the second photovoltaic cell, wherein an output node of the first electrical equivalent circuit is connected with an output node of second electrical equivalent circuit by an equivalent resistance having a value representing an electrical resistance of ribbons electrically connecting the first photovoltaic cell with the second photovoltaic cell; and determining a first electrical operating point of the first photovoltaic cell and a second electrical operating point of the second photovoltaic cell.

9. The method according to claim 8, wherein obtaining the first thermal energy value generated in the first photovoltaic cell further comprises calculating a first electrical energy value generated by the first photovoltaic cell at the first electrical operating point and deducting the first electrical energy value from the first optically absorbed energy value, and wherein obtaining the second thermal energy value generated in the second photovoltaic cell further comprises calculating a second electrical energy value generated by the second photovoltaic cell at the second electrical operating point and deducting the second electrical energy value from the second optically absorbed energy value.

10. The method according to claim 5, further comprising:

obtaining an ambient temperature value, a wind velocity value, and a wind direction indication;

determining, within the predetermined time interval, a first heat transfer coefficient value for the first photovoltaic cell and a second heat transfer coefficient value for the second photovoltaic cell, wherein determining the first heat transfer coefficient value and the second heat transfer coefficient value includes taking into account the ambient temperature value, the wind velocity value, the wind direction indication, and a location of the first photovoltaic cell and the second photovoltaic cell within the photovoltaic module; and providing the first heat transfer coefficient value as an input to the first thermal equivalent circuit and providing the second heat transfer coefficient value as an input to the second thermal equivalent circuit.

11. The method according to claim 5 wherein the method further comprises calculating an electrical energy value generated by the photovoltaic module as a function of time under non-steady-state operating conditions, with a temporal granularity corresponding to the predetermined time interval.

12. The method according to claim 5, wherein the predetermined time interval has a duration of 5 seconds or less.

13. A non-transitory, computer readable storage medium having instructions stored therein, wherein the instructions are for calculating a performance of a photovoltaic module comprising at least a first photovoltaic cell and a second photovoltaic cell, and wherein the instructions, when executed by a processor, comprise:

calculating a heat flow between the first photovoltaic cell and the second photovoltaic cell, wherein calculating the heat flow includes using a first thermal equivalent circuit of the first photovoltaic cell and a second thermal equivalent circuit of the second photovoltaic cell, wherein at least one node of the first thermal equivalent circuit is connected to a corresponding node of the second thermal equivalent circuit by a thermal coupling resistance.

14. A data simulation and modeling system comprising means for carrying out a method for calculating a performance of a photovoltaic module comprising at least a first photovoltaic cell and a second photovoltaic cell, the method comprising:

calculating a heat flow between the first photovoltaic cell and the second photovoltaic cell, wherein calculating the heat flow includes using a first thermal equivalent circuit of the first photovoltaic cell and a second thermal equivalent circuit of the second photovoltaic cell, wherein at least one node of the first thermal equivalent circuit is connected to a corresponding node of the second thermal equivalent circuit by a thermal coupling resistance.

* * * * *